(12) United States Patent
Asakawa et al.

(10) Patent No.: US 8,320,093 B2
(45) Date of Patent: Nov. 27, 2012

(54) COMPOSITE ELECTRONIC DEVICE

(75) Inventors: Masao Asakawa, Tokyo (JP); Tomokazu Ito, Tokyo (JP); Sho Nakagomi, Tokyo (JP); Atsushi Hitomi, Tokyo (JP); Yasuhiro Hirobe, Tokyo (JP); Kensaku Asakura, Tokyo (JP)

(73) Assignee: TDK Corporation, Tokyo (JP)

( * ) Notice: Subject to any disclaimer, the term of this patent is extended or adjusted under 35 U.S.C. 154(b) by 356 days.

(21) Appl. No.: 12/829,840

(22) Filed: Jul. 2, 2010

(65) Prior Publication Data
US 2011/0002075 A1 Jan. 6, 2011

(30) Foreign Application Priority Data

Jul. 2, 2009 (JP) ................................. 2009-158258
Sep. 16, 2009 (JP) ................................. 2009-214285

(51) Int. Cl.
*H01C 7/12* (2006.01)
(52) U.S. Cl. ...................................... 361/118; 361/119
(58) Field of Classification Search ............ 361/117–119
See application file for complete search history.

(56) References Cited

U.S. PATENT DOCUMENTS

| 4,977,357 | A | 12/1990 | Shrier | |
|---|---|---|---|---|
| 7,064,629 | B2 * | 6/2006 | Shoji | ............................. 333/185 |
| 7,295,087 | B2 | 11/2007 | Tomonari et al. | |
| 2004/0233606 | A1 * | 11/2004 | Inoue et al. | .................... 361/118 |
| 2009/0154052 | A1 | 6/2009 | Yoneda et al. | |
| 2011/0007438 | A1 * | 1/2011 | Ito et al. | .......................... 361/56 |

FOREIGN PATENT DOCUMENTS

| JP | 53-122744 | 10/1978 |
|---|---|---|
| JP | 02-503049 | 9/1990 |
| JP | 2005-354140 | 12/2005 |
| JP | 2006-066848 | 3/2006 |
| JP | 2007-123352 | 5/2007 |
| JP | 2007-214166 | 8/2007 |
| JP | 2008-028214 | 2/2008 |
| JP | 2009-117735 | 5/2009 |
| WO | WO 2007/029615 A1 | 3/2007 |

* cited by examiner

*Primary Examiner* — Danny Nguyen
(74) *Attorney, Agent, or Firm* — McDermott Will & Emery LLP

(57) ABSTRACT

The present invention is provided with a composite electronic device comprising an inductor element and an ESD protection element formed between two magnetic substrates, wherein the inductor element includes insulation layers made of a resin, and spiral conductors formed on the insulation layers, the ESD protection element includes a base insulation layer, a pair of gap electrodes arranged via gap formed therebetween on the base insulation layer, and an ESD absorbing layer arranged at least between the gap electrodes, and the ESD absorbing layer includes a composite material having an insulation inorganic material and a conductive inorganic material discontinuously dispersed in a matrix of the insulation inorganic material. The gap of the ESD protection element is provided at exterior of the spiral conductor so as not to be overlapped with the spiral conductor in view of a laminating direction.

11 Claims, 11 Drawing Sheets

COMPOSITE ELECTRONIC DEVICE

TECHNICAL FIELD

The present invention relates to a composite electronic device, and, more particularly relates to a structure of a composite electronic device constituted by combining inductor elements and electrostatic discharge (ESD) protection elements.

BACKGROUND OF THE INVENTION

In recent years, standards of USB 2.0 and a high-definition multimedia interface (HDMI) have been widely distributed as high-speed signal transmission interfaces, and they are used in many digital devices such as personal computers and digital high-vision televisions. These interfaces employ a differential signal system that transmits a differential signal (a differential mode signal) by using a pair of signal lines, unlike a single-end transmission system that has been generally used for many years.

The differential transmission system has excellent characteristics in that the system is not easily affected by exogenous noise as well as that the system has a small radiation electromagnetic field generated from the signal lines, as compared with the single-end transmission system. Therefore, a signal can have small amplitude, and the system can perform a higher-speed signal transmission than the single-end transmission system, by shortening arise time and a fall time based on the small amplitude.

FIG. 10 is a circuit diagram of a general differential transmission circuit.

The differential transmission circuit shown in FIG. 10 includes a pair of signal lines 1 and 2, an output buffer 3 that supplies a differential mode signal to the signal lines 1 and 2, and an input buffer 4 that receives a differential mode signal from the signal lines 1 and 2. In this configuration, an input signal IN given to the output buffer 3 is transmitted to the input buffer 4 via the pair of signal lines 1 and 2, and is reproduced as an output signal OUT. This differential transmission circuit has a characteristic that a radiation electromagnetic field generated from the signal lines 1 and 2 is small, as described above. However, this circuit generates a relatively large radiation electromagnetic field when common noise (common mode noise) is superimposed on the signal lines 1 and 2. To decrease the radiation electromagnetic field generated by the common mode noise, it is effective to insert a common-mode filter (common-mode choke coil) 5 into the signal lines 1 and 2, as shown in FIG. 10.

The common-mode filter 5 has characteristics that impedance to a differential component (a differential mode signal) transmitted through the signal lines 1 and 2 is low and that impedance to an in-phase component (common mode noise) is high. Therefore, by inserting the common-mode filter 5 into the signal lines 1 and 2, common mode noise transmitted through the pair of signal lines 1 and 2 can be interrupted without substantially attenuating the differential mode signal.

In a latest high-speed digital interface such as an HDMI, an IC very sensitive to static electricity is used because the interface handles a fine signal of a high transmission rate. Accordingly, ESD (electrostatic discharge) becomes a large problem. To prevent destruction of the IC due to ESD, a varistor is used as an ESD countermeasure device between the signal lines and a ground. However, when the varistor is used, a signal waveform becomes inert, and signal quality is degraded. Therefore, a lower-capacitance ESD countermeasure device is required. For example, as shown in FIG. 11, Japanese Patent Application Laid-open No. 2008-28214 proposes an ESD protection circuit having an electrostatic capacitance of an ESD protection device 9 set to 0.3 pF or lower, by connecting a coil 8 in series on signal lines 7 connected to an IC 6 and by connecting the ESD protection device 9 between each signal line 7 and the ground (see FIG. 8 of Japanese Patent Application Laid-open No. 2008-28214).

Japanese Patent Application Laid-open No. 2007-214166 discloses a structure having a voltage-dependency resistance material having an ESD protection function provided on an uppermost part of a composite electronic device accommodating a common-mode noise filter and the ESD protection function in one package. According to this structure, the voltage-dependency resistance material can be provided after sintering a laminated body containing many insulation layers. With this arrangement, it is possible to prevent reduction of the ESD protection function due to oxidation and cracking of the voltage-dependency resistance material at a sintering time. Consequently, the ESD protection function can be improved.

However, according to the common mode filter described in Japanese Patent Application Laid-open No. 2007-214166, the voltage-dependency resistance material constituting ESD protection elements contains a resin. Therefore, the ESD protection elements need to be provided on the uppermost part due to a constraint of a manufacturing step which becomes a large constraint on design. The voltage-dependency resistance material is filled into a very fine gap of about 10 μm. At the uppermost part, an uneven area is large in a plane surface due to a structure that many insulation layers formed with conductor patterns are laminated. Consequently, it is considerably difficult to stably form a very fine gap. Further, in forming the ESD protection elements on a top layer, the manufacturing step becomes complex, and manufacturing cost increases.

SUMMARY OF THE INVENTION

Therefore, it is an object of the present invention to provide a compact and high-performance composite electronic device constituted by combining a common mode filter and ESD protection elements having a small electrostatic capacitance and excellent discharge characteristic, heat resistance, and weatherability.

To solve the problems described above, the composite electronic device according to the present invention comprises an inductor element and an ESD protection element formed between two magnetic substrates, wherein the inductor element includes a insulation layer made of a resin, and a spiral conductor formed on the insulation layer, the ESD protection element includes a base insulation layer, at least one pair of electrodes arranged via gap formed therebetween on the base insulation layer, and an ESD absorbing layer arranged at least between the pair of electrodes, the ESD absorbing layer includes a composite material having an insulation inorganic material and a conductive inorganic material discontinuously dispersed in a matrix of the insulation inorganic material, and the gap is provided at exterior of the spiral conductor of the inductor element so as not to be overlapped with the spiral conductor in view of a laminating direction.

According to the present invention, the composite electronic device includes low-voltage discharge type ESD protection elements having a very small electrostatic capacitance, a low discharge starting voltage, and excellent discharge resistance. Therefore, the composite electronic device can transmit a signal equivalent to a signal having no ESD countermeasure, and can suppress reduction of characteristic impedance. Further, because a composite of a conductive inorganic material and an insulation inorganic material is configured as an ESD protection material, pressure resistance can be remarkably increased, and weatherability in external environments such as temperature and humidity can be remarkably increased. Because the inductor elements and the ESD protection elements are formed in one chip, a very compact and high-performance electronic device can be provided.

According to the present invention, since the gaps are provided so as not to overlap the spiral conductors, even though the ESD protection elements are partially damaged and deformed when absorbing static electricity, the spiral conductors can be avoided from being damaged and deformed. In particular, since the gaps are disposed at exterior of the spiral conductors, the gaps having the sufficient length can be formed by effectively using at exterior of blank spaces of the spiral conductors. Thereby, since a discharge path between the gaps can be lengthened, a static electricity protection function can be prevented from being lowered and the life span of a product can be increased.

In the present specification, "composite" means a state that a conductive inorganic material is dispersed in a matrix of an insulation inorganic material. This is a concept including not only a state that a conductive inorganic material is dispersed uniformly or at random in a matrix of an insulation inorganic material but also a state that an aggregate of a conductive inorganic material is dispersed in a matrix of an insulation inorganic material, that is, a state generally called a sea-island structure. In the present specification, "insulation" means resistance that is equal to or higher than 0.1 Ωcm, and "conductivity" means resistance that is lower than 0.1 Ωcm. So-called "semiconductivity" is included in the former so long as specific resistance thereof is equal to or higher than 0.1 Ωcm.

In the present invention, the spiral conductor is preferably a round spiral, and the gap has preferably arc-shape along an outer circumference of the spiral conductor. The round spiral conductors are preferably used as high-frequency inductance because attenuation is small in the high-frequency band. In this case, however, narrow blank spaces exist at interior of the spiral conductors, but wide blank spaces exist outside the spiral conductors. However, when the gaps are provided at exterior of the round spiral conductors, the outer blank spaces can be effectively used and the length of the gaps can be sufficiently secured. In particular, since the gaps come close to the spiral conductors to form arc-shape along outer circumference of the spiral conductors, the gaps can be formed as long as possible while being formed in the substrate as deep as possible. Thereby, ESD protection elements having the long life span that can endure plural times of electrostatic discharge can be formed.

The composite electronic device according to the present invention preferably includes a magnetic core provided at interior of the spiral conductor. According to this configuration, a magnetic characteristic of the spiral conductors can be improved.

In the present invention, the number of the pair of electrodes is preferably as same as that of input and output terminals of the inductor element. According to the present invention, since the composite electronic device is a symmetric circuit where the pair of ESD protection elements are provided on both the input side and the output side, the composite electronic device can be provided as a chip component where a mounting direction is not restricted.

The composite electronic device according to the present invention preferably includes short-circuiting patterns electrically connecting each ground side of the pair of electrodes. In this case, it is particularly preferable that the short-circuiting patterns are linear patterns. If the short-circuiting patterns are configured as the linear patterns, the capacity of the gap electrodes can be prevented from increasing and the electrostatic capacitance of the ESD protection elements can be suppressed to 0.35 pF or less.

In the present invention, the inductor element preferably includes first and second spiral conductors formed on a plane surface perpendicular to a laminating direction, and the first and second spiral conductors are magnetically coupled with each other and thereby constitute a common mode filter. According to this constitution, common mode noise can be removed while preventing ESD. Therefore, the inductor elements can be preferably used to remove noise of a high-speed digital signal line requiring an ESD countermeasure.

In the present invention, an electrostatic capacitance of the ESD protection element has a value preferably equal to or lower than 0.35 pF. When the electrostatic capacitance of the ESD protection element is 0.35 pF or less, a differential-transmission impedance standard (100±15Ω) of a high-speed differential transmission line of a DVI (digital visual interface) and an HDMI can be satisfied. Therefore, destruction of an IC due to ESD can be securely prevented without giving practical influence to a signal quality.

In the present invention, a material of the resin is one of the polyimide resin and an epoxy resin. An insulation inorganic material is preferably at least one kind selected from a group of $Al_2O_3$, $TiO_2$, $SiO_2$, ZnO, $In_2O_3$, NiO, CoO, $SnO_2$, $V_2O_5$, CuO, MgO, $ZrO_2$, AlN, BN, and SiC. Because these metal oxides are excellent in insulation, heat resistance, and weatherability, these metal oxides function effectively as materials constituting an insulation matrix of a composite. As a result, it is possible to realize highly-functional ESD protection elements having excellent discharge characteristic, heat resistance, and weatherability. Because these metal oxides are obtainable at a low cost and because a sputtering method can be applied to these metal oxides, productivity and economics can be increased.

In the present invention, a conductive inorganic material is preferably at least one kind of metal or a metal compound of these metals selected from a group of C, Ni, Cu, Au, Ti, Cr, Ag, Pd, and Pt. By compounding these metals or a metal compound in a state of a discontinuous dispersion in a matrix of an insulation inorganic material, highly-functional ESD protection elements having excellent discharge characteristic, heat resistance, and weatherability can be realized.

In the present invention, an ESD absorbing layer is preferably a composite formed by sequentially sputtering an insulation inorganic material and a conductive inorganic material, or a composite formed by simultaneously sputtering an insulation inorganic material and a conductive inorganic material. By this arrangement, a composite containing a conductive inorganic material in a state of a discontinuous dispersion in a matrix of an insulation inorganic material can be easily obtained in good reproducibility, so that productivity and economics can be increased.

A composite electronic device according to the present invention comprises a common-mode filter layer and an ESD protection layer provided between two magnetic substrates, wherein the common-mode filter layer includes first and second insulation layers made of a resin, a first spiral conductor formed on the first insulation layer, and a second spiral conductor formed on the second insulation layer, the ESD protection layer includes a first ESD protection element connected to one end of the first spiral conductor, and a second ESD protection element connected to one end of the second spiral conductor, the first and second spiral conductors are formed in a plane-surface direction perpendicular to a laminating direction, and are arranged to be magnetically coupled to each other, each of the first and second ESD protection elements includes a base insulation layer, a pair of electrodes arranged via gap formed therebetween on the base insulation layer, and ESD absorbing layer arranged at least between the pair of electrodes, the ESD absorbing layer includes a composite material having an insulation inorganic material and a conductive inorganic material discontinuously dispersed in a matrix of the insulation inorganic material, and the gap of the first and second ESD protection elements are provided at exterior of the first and second spiral conductors of the inductor element so as not to be overlapped with the first and second spiral conductors in view of the laminating direction.

The composite electronic device according to the present invention further includes a third ESD protection element connected to the other end of the first spiral conductor, and a fourth ESD protection element connected to the other end of the second spiral conductor, wherein the third and fourth ESD protection elements have the same configurations as those of the first and second ESD protection elements, and the gap of the third and fourth ESD protection elements are provided at exterior of the first and second spiral conductors of the inductor element so as not to be overlapped with the first and second spiral conductors in view of the laminating direction. According to this configuration, because the ESD protection elements are connected to both of a pair of input ends and a pair of output ends of the composite electronic device, the composite electronic device can be mounted without requiring consciousness of a direction of connection to a pair of signal lines. Consequently, handling at a manufacturing time can be facilitated.

As described above, according to the present invention, it is possible to provide a compact and high-performance composite electronic device constituted by combining a common mode filter and ESD protection elements having a small electrostatic capacitance and excellent discharge characteristic, heat resistance, and weatherability. Particularly, the composite electronic device according to the present invention has a significant effect in a high-speed signal interface such as a high-speed HDMI having a large signal-transmission amount and a very high transmission speed. Further, according to the present invention, it is possible to provide a composite electronic device having ESD protection elements that do not decrease the performance even if the ESD absorbing is repeatedly-performed and have excellent durability.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will be explained below in detail with reference to the accompanying drawings.

Figure 1:
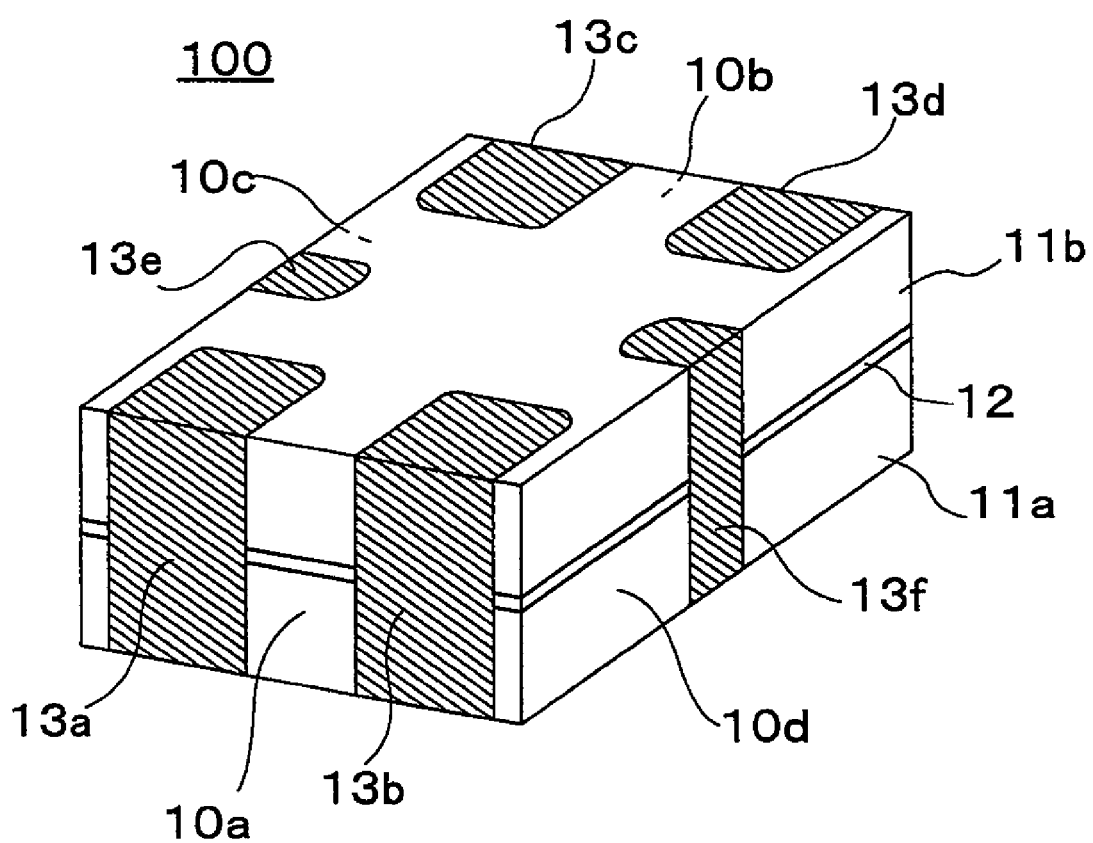
FIG. 1 is a schematic perspective view showing an external configuration of a composite electronic device 100 according to a first embodiment of the present invention.

FIG. 1 is a schematic perspective view showing an external configuration of a composite electronic device 100 according to a first embodiment of the present invention.

As shown in FIG. 1, the composite electronic device 100 according to the first embodiment is a thin-film common mode filter having an ESD protection function, and includes first and second magnetic substrates 11a and 11b, and a function layer 12 sandwiched between the first magnetic substrate 11a and the second magnetic substrate 11b. First to sixth terminal electrodes 13a to 13f are formed on an external peripheral surface of a laminated body constituted by the first magnetic substrate 11a, the function layer 12, and the second magnetic substrate 11b. The first and second terminal electrodes 13a and 13b are formed on a first side surface 10a orthogonal with longitudinal direction of the laminated body. The third and fourth terminal electrodes 13c and 13d are formed on a second side surface 10b opposite to the first side surface 10a. The fifth terminal electrode 13e is formed on a third side surface 10c orthogonal with the first and second side surfaces 10a and 10b. The sixth terminal electrode 13f is formed on a fourth side surface 10d opposite to the third side surface.

The first and second magnetic substrates 11a and 11b physically protect the function layer 12, and serve as a closed magnetic path of the common mode filter. Sintered ferrite, composite ferrite (a resin containing powdery ferrite), and the like can be used as materials of the first and second magnetic substrates 11a and 11b. The sintered ferrite having high mechanical strength and excellent magnetic characteristics is particularly preferably used.

Figure 2:
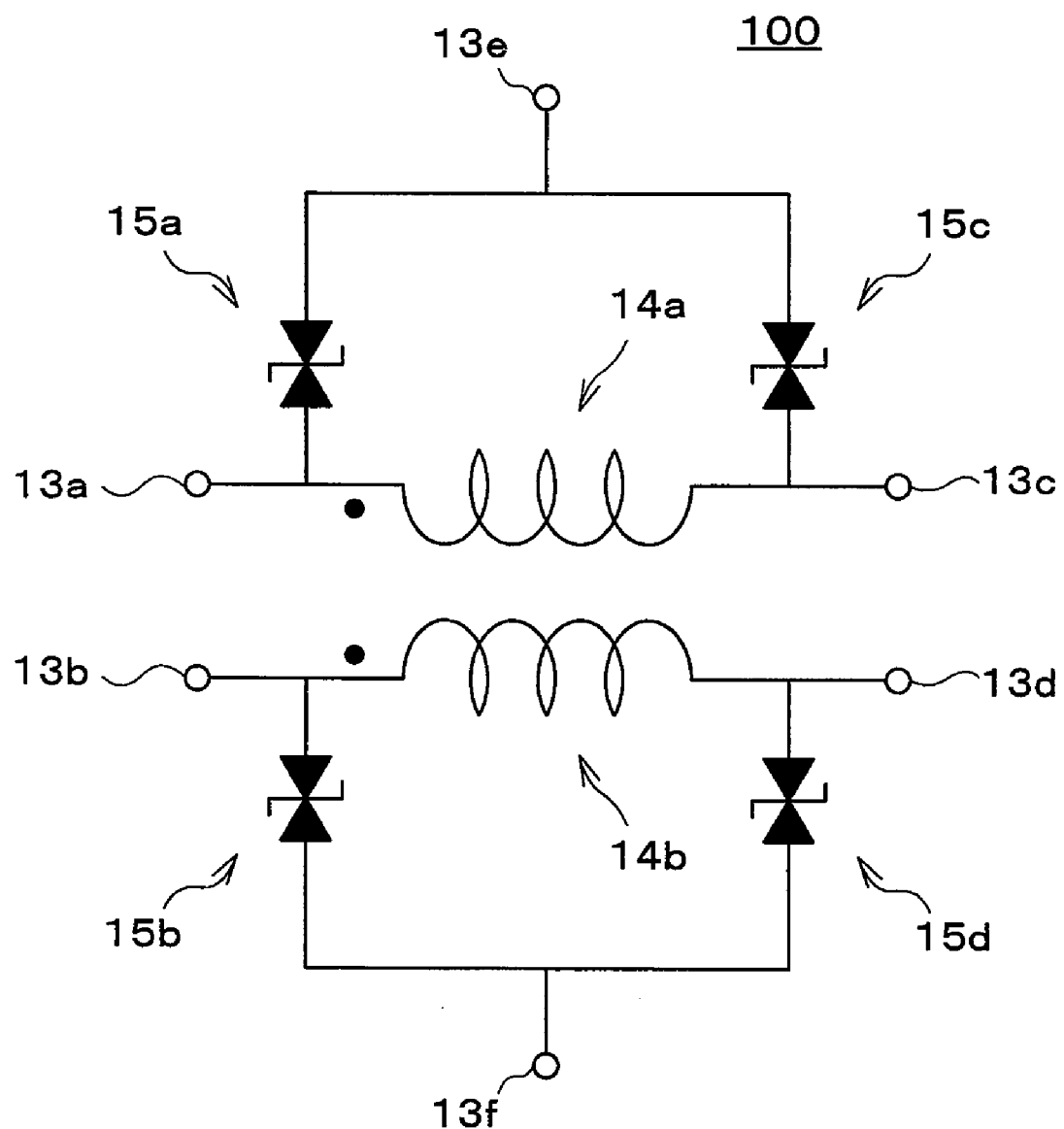
FIG. 2 is a circuit diagram showing a configuration of the composite electronic device 100.

FIG. 2 is a circuit diagram showing a configuration of the composite electronic device 100.

As shown in FIG. 2, the composite electronic device 100 includes inductor elements 14a and 14b functioning as a common-mode choke coil, and ESD protection elements 15a to 15d. One ends of the inductor elements 14a and 14b are connected to the first and second terminal electrodes 13a and 13b, respectively, and the other ends of the inductor elements 14a and 14b are connected to the third and fourth terminal electrodes 13c and 13d, respectively. One ends of the ESD protection elements 15a and 15b are connected to the first and second terminal electrodes 13a and 13b, respectively, and the other ends of the ESD protection elements 15a and 15b are connected to the fifth and sixth terminal electrodes 13e and 13f, respectively. One ends of the ESD protection elements 15c and 15d are connected to the third and fourth terminal electrodes 13c and 13d, respectively, and the other ends of the ESD protection elements 15c and 15d are connected to the fifth and sixth terminal electrodes 13e and 13f, respectively. Therefore, the fifth terminal electrode 13e is a common terminal electrode to the ESD protection elements 15a and 15c, and the sixth terminal electrode 13f is a common terminal electrode to the ESD protection elements 15b and 15d.

Figure 10:
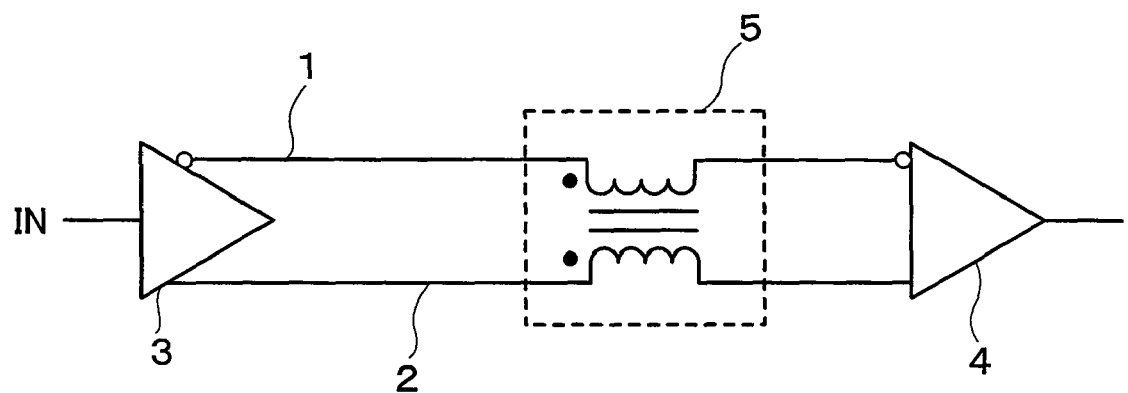
FIG. 10 is a circuit diagram of a general differential transmission circuit.
Figure 11:
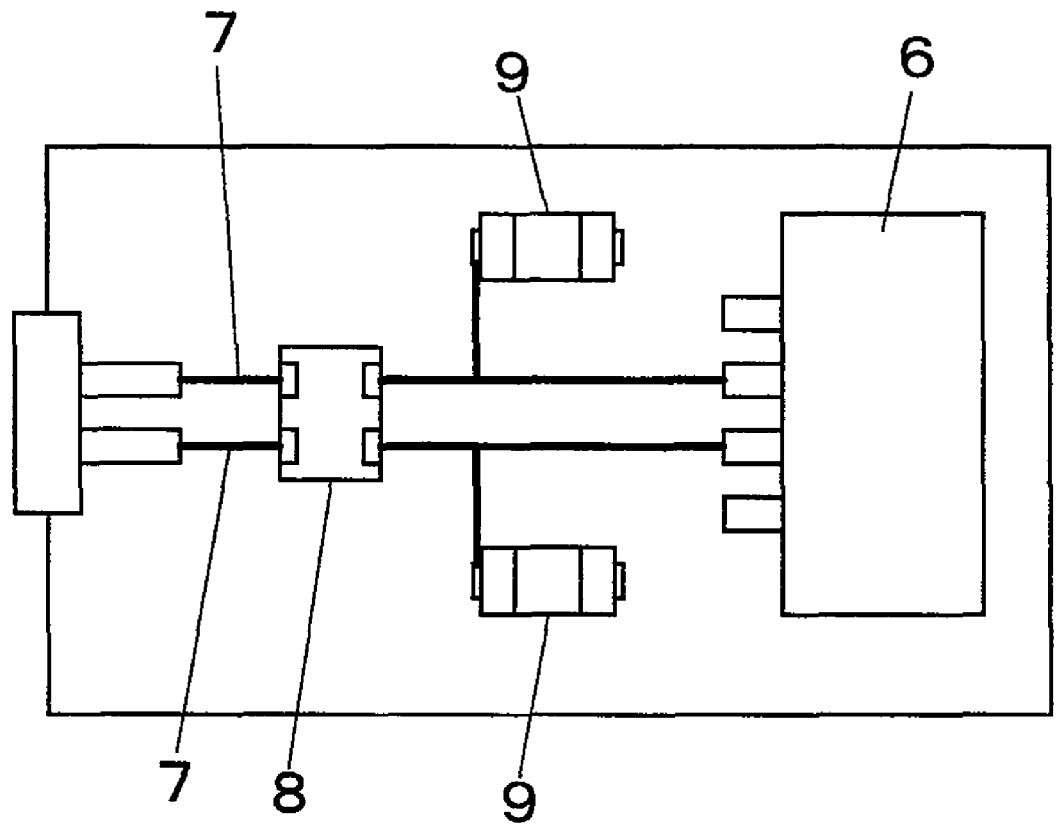
FIG. 11 is a circuit diagram showing a configuration of a conventional ESD countermeasure circuit.

As shown in FIG. 10, the composite electronic device 100 is mounted on a pair of signal lines. In this case, the first and second terminal electrodes 13a and 13b are connected to the input side of the signal lines, and the third and fourth terminal electrodes 13c and 13d are connected to an output side of the signal lines. The fifth and sixth terminal electrodes 13e and 13f are connected to a ground line. Since the composite electronic device 100 of this embodiment is symmetric circuit having a pair of the ESD protection element at the side of the input terminal and the output terminal, the circuit configuration on which the first and second terminal electrodes 13a and 13b is coupled to the input side of the signal line is as same as the circuit configuration on which the first and second terminal electrodes 13a and 13b is coupled to the output side of the signal line.

Figure 3:
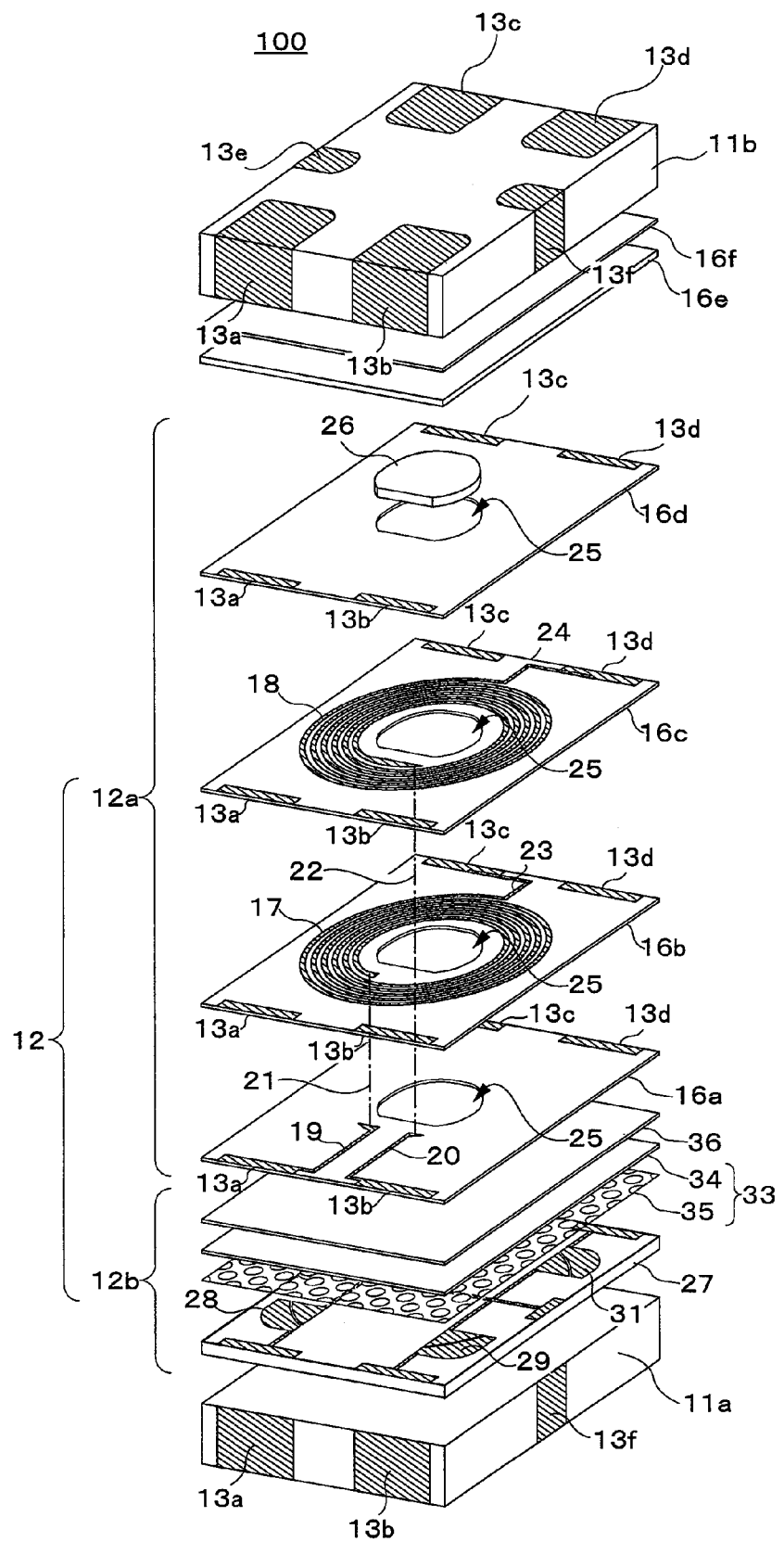
FIG. 3 is a schematic exploded perspective view showing one example of a layer structure of the composite electronic device 100.

FIG. 3 is a schematic exploded perspective view showing one example of a layer structure of the composite electronic device 100.

As shown in FIG. 3, the composite electronic device 100 includes the first and second magnetic substrates 11a and 11b, and the function layer 12 sandwiched between the first and second magnetic substrates 11a and 11b. The function layer 12 is constituted by a common-mode filter layer 12a and an ESD protection layer 12b.

The common-mode filter layer 12a includes insulation layers 16a to 16d laminated in order from the ESD protection layer 12b to the second magnetic substrate 11b, a magnetic layer 16e, an adhesive layer 16f, a first spiral conductor 17 formed on the insulation layer 16b, a second spiral conductor 18 formed on the insulation layer 16c, a first lead conductor 19 and a second lead conductor 20 formed on the insulation layer 16a.

The insulation layers 16a to 16d insulate between conductor patterns, or conductor patterns and the magnetic layer 16e, and function to secure the flatness of a base surface on which the conductor patterns are formed. For materials of the insulation layers 16a to 16d, it is preferable to use a resin excellent in electric and magnetic insulation and having a good workability. Preferably, a polyimide resin and an epoxy resin are used. Preferably, Cu, Al and the like excellent in conductivity and workability are used for conductor patterns. The conductor patterns can be formed by an etching method and an additive method (plating) using photolithography.

An opening 25 piercing through the insulation layers 16a to 16d is provided at an interior portion of the first and second spiral conductors 17 and 18 as center regions of the insulation layers 16a to 16d. A magnetic core 26 to form a magnetic path is provided into the opening 25. A resin containing a magnetic powder (a composite ferrite) is preferably used for materials for the magnetic core 26.

The magnetic layer 16e is formed on a surface of the insulation layer 16d. The magnetic core 26 within the opening 25 is formed by curing a paste of composite ferrite. At a curing time, the resin is contracted, and unevenness occurs at an opening portion. To decrease this unevenness, it is preferable to coat the paste on a whole surface of the insulation layer 16d as well as the interior portion of the opening 25. The magnetic layer 16e is formed to secure this flatness.

The adhesive layer 16f is a layer necessary to bond the magnetic substrate 11b onto the magnetic layer 16e. The adhesive layer 16f also functions to suppress the unevenness of the surfaces of the magnetic substrate 11b and the magnetic layer 16e, and increase close adhesiveness. While not particularly limited, an epoxy resin, a polyimide resin, and a polyamide resin can be used as materials of the adhesive layer 16f.

The first spiral conductor 17 corresponds to the inductor element 14a shown in FIG. 2. An internal peripheral end of the first spiral conductor 17 is connected to the first terminal electrode 13a via a first contact hole conductor 21 and the first lead conductor piercing through the insulation layer 16b. An external peripheral end of the first spiral conductor 17 is connected to the third terminal electrode 13c via a third lead conductor 23.

The second spiral conductor 18 corresponds to the inductor element 14b shown in FIG. 2. An internal peripheral end of the second spiral conductor 18 is connected to the second terminal electrode 13b via a second contact-hole conductor 22 and the second lead conductor 20 piercing through the insulation layer 16b and 16c. An external peripheral end of the second spiral conductor 18 is connected to the fourth terminal electrode 13d via a fourth lead conductor 24. In this embodiment, the second lead conductor 20 is provided on the insulation layer 16a common to the first lead conductor 19, but may be provided on an insulation layer different from the first lead conductor 19.

The first and second spiral conductors 17 and 18 have the same plane surface shape, and are provided at the same position as a planar view. The first and second spiral conductors 17 and 18 are completely overlapped with each other, and therefore, a strong magnetic coupling occurs between the first and second spiral conductors 17 and 18. Based on the above configuration, conductor patterns within the common-mode filter layer 12a constitute a common mode filter.

Both the first and second spiral conductors 17 and 18 have round spiral shape. The round spiral conductors are preferably used as high-frequency inductance because attenuation is small in the high-frequency band. On the other hand, loop size of the round spiral conductor is smaller than that of the square spiral conductor, and it is also difficult to use square mounting area efficiently.

The common mode filter layer 12a was explained above, and the ESD protection layer 12b will be explained next.

The ESD protection layer 12b includes a base insulation layer 27, first to fourth gap electrodes (parallel electrodes) 28 to 31 formed on a surface of the base insulation layer 27, and an ESD absorbing layer 33 covering the first to fourth gap electrodes 28 to 31, and a protection layer 36 covering the ESD absorbing layer 33. The protection layer 36 is a resin layer containing a magnetic powder provided between the ESD protection layer 12b (ESD absorbing layer 33) and common mode filter layer 12a for insulating and separating thereof.

Figure 4A:
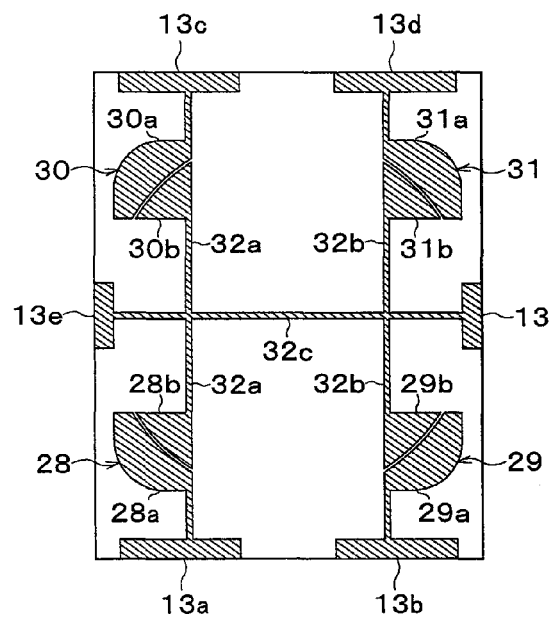
FIG. 4A is a schematic plan view showing a positional relationship between the gap electrodes 28 to 31 and other conductor patterns (short-circuiting patterns 32a to 32c)
Figure 4B:
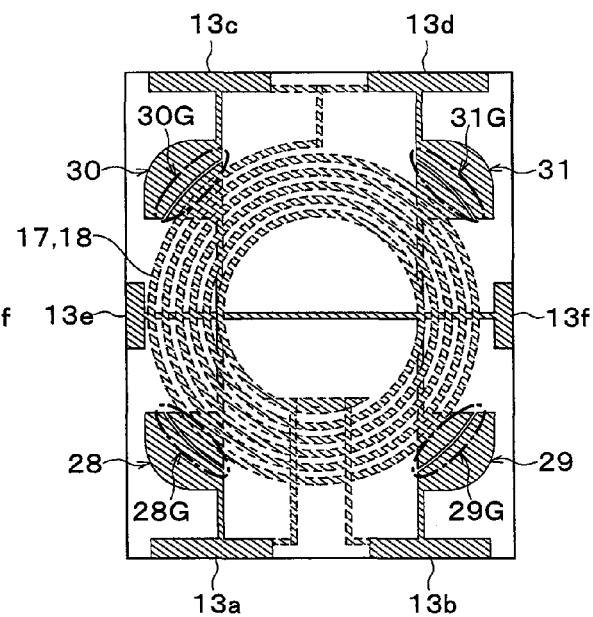
FIG. 4B is a schematic plan view showing a positional relationship between the gap electrodes 28 to 31 and other conductor patterns (spiral conductors 17 and 18)

FIG. 4A is a schematic plan view showing a positional relationship between the gap electrodes 28 to 31 and other conductor patterns (short-circuiting patterns 32a to 32c). FIG. 4B is a schematic plan view showing a positional relationship between the gap electrodes 28 to 31 and other conductor patterns (spiral conductors 17 and 18).

As shown in FIG. 4A, a layer structure near the first gap electrode 28 is a portion functioning as the first ESD protection element 15a shown in FIG. 2, and a layer structure near the second gap electrode 29 is a portion functioning as the second ESD protection element 15b. Further, a layer structure near the third gap electrode 30 is a portion functioning as the third ESD protection element 15c shown in FIG. 2, and a layer structure near the fourth gap electrode 31 is a portion functioning as the fourth ESD protection element 15d.

For this reason, one electrode 28a of the first gap electrode 28 is connected to the first terminal electrode 13a and the other electrode 28b is connected to the fifth terminal electrode 13e through the short-circuiting patterns 32a and 32c. One electrode 29a of the second gap electrode 29 is connected to the second terminal electrode 13b and the other electrode 29b is connected to the sixth terminal electrode 13f through the short-circuiting patterns 32b and 32c. One electrode 30a of the third gap electrode 30 is connected to the third terminal electrode 13c and the other electrode 30b is connected to the fifth terminal electrode 13e through the short-circuiting patterns 32a and 32c. One electrode 31a of the fourth gap electrode 31 is connected to the fourth terminal electrode 13d and the other electrode 31b is connected to the sixth terminal electrode 13f through the short-circuiting patterns 32b and 32c.

In this embodiment, the other electrodes 28b, 29b, 30b, and 31b of the gap electrodes are electrically connected to each other through the short-circuiting patterns 32a to 32c. Although not limited in particular, the widths of the short-circuiting patterns 32a to 32c are preferably almost equal to those of the first and second lead conductors 19 and 20. The short-circuiting patterns include the short-circuiting patterns 32a and 32b that extend in a long-side direction of a rectangular mounting area and the third short-circuiting pattern 32c that extends in a short-side direction of the rectangular mounting area. The first gap electrode 28 and the third gap electrode 30 are connected by the first short-circuiting pattern 32a, the second gap electrode 29 and the fourth gap electrode 31 are connected by the second short-circuiting pattern 32b, and the first and second short-circuiting patterns 32a and 32b and the fifth and sixth terminal electrodes 13e and 13f are short-circuited by the third short-circuiting pattern 32c that passes through the central portion of the round spiral conductor. By this pattern structure, a short-circuiting state between the gap electrodes can be secured, separation of the conductor patterns during processing can be prevented, and mechanical strength of the composite electronic device 100 can be secured.

As shown in FIG. 4B, the gap electrodes 28 to 31 are provided in an obliquely upward direction to the right side, an obliquely downward direction to the right side, an obliquely upward direction to the left side, and an obliquely downward direction to the left side, respectively, when viewed from the centers of the spiral conductors 17 and 18. In this case, "obliquely" means a direction that is oblique to the long side of the rectangular mounting area or to the short side orthogonal to the long side of the rectangular mounting area. As such, since the gap electrodes 28 to 31 are provided in the four oblique directions, the gaps can be efficiently disposed without overlapping the spiral conductors 17 and 18 or the lead conductors 19 and 20.

Gaps 28G to 31G held by the gap electrodes 28 to 31 are provided at exterior of the first and second spiral conductors 17 and 18 and at positions not overlapped on the plane with the first and second spiral conductors 17 and 18 and the first and second lead conductors 19 and 20. While details thereof are described later, because ESD protection elements are partially damaged or deformed due to absorption of ESD, conductor patterns have a risk of being damaged at the same time when the conductor patterns are arranged at a position overlapped with the ESD protection elements. However, because the gaps 28G to 31G of the ESD protection elements are provided at positions deviated from the conductive patterns, influence to upper and lower layers can be suppressed when the ESD protection elements are partially destroyed by ESD, and a composite electronic device having higher reliability can be realized.

It is important that the gaps 28G to 31G is located at the outside of the spiral conductor 17 and 18. In the round spiral conductor, although inner blank space is small, outer blank space is large. At this time, one electrode (corresponding to electrodes 28a to 31a) of the pair of electrodes that constitute each gap electrode is disposed at the position that is closer to the outside than the outermost circumference of the spiral conductor and does not overlap the spiral conductor, but the other electrodes (corresponding to electrodes 28b to 31b) are disposed at the positions overlapping the spiral conductors 17 and 18. Thereby, a chip size can be decreased. If the gaps are formed in arc-shape along the outermost circumference of the spiral conductors 17 and 18 and are disposed to come close to the outermost circumference, the gaps can be disposed in the rectangular mounting surface as deep as possible, and the size of the gap can be maximized. The curvature of the gaps having the arc-shape is not necessarily matched with the curvature of the spiral conductors. For example, the curvature of the gaps may be more than the curvature of the spiral conductors or the gaps may be linear.

The number of gap electrodes is four and is equal to the number of terminal electrodes of the inductor element. That is, the gap electrodes are provided in input/output terminals of the common mode filter corresponding to a four-terminal circuit. The four gap electrodes 28 to 31 are provided in the four oblique directions, respectively. In this embodiment, however, central points of the gaps 28G to 31G having arc-shape in a longitudinal direction are preferably disposed in an oblique direction of 45 degrees, when viewed from the centers of the round spiral conductors. In other words, the central points of the gaps 28G to 31G in the longitudinal direction are preferably disposed in a direction of $(2n-1)\pi/4$, when viewed from the centers of the round spiral conductors. Since the gaps having the arc-shape that are disposed in the above way can be formed as long as possible, plural current paths can be secured and static electricity can be absorbed. Accordingly, durability of the ESD protection elements can be heightened.

Figure 5A:
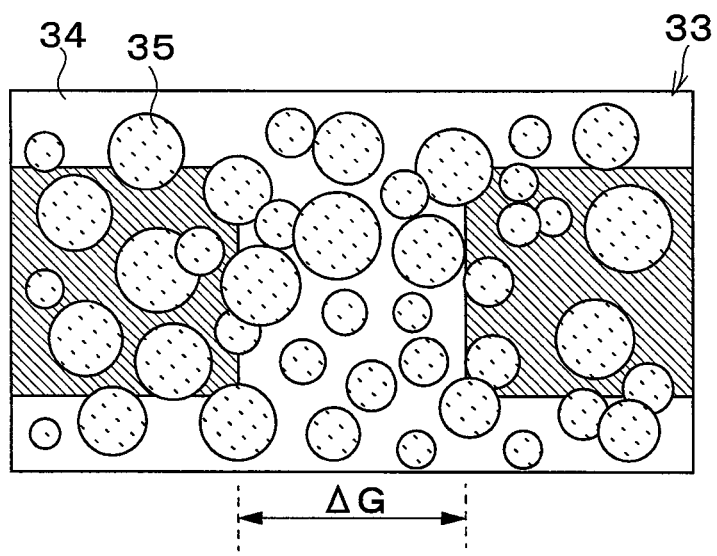
FIG. 5A is a schematic plan view showing one example of a layer structure near the first gap electrode 28 in the ESD protection layer 12b.
Figure 5B:
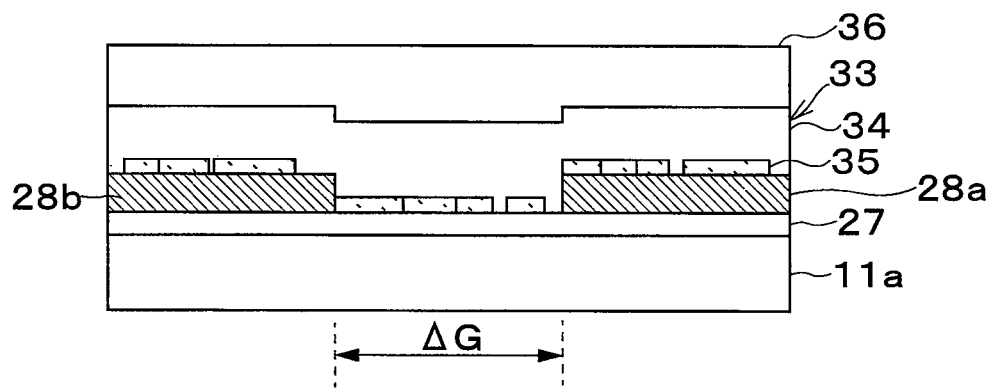
FIG. 5B is a schematic cross-sectional view showing one example of a layer structure near the first gap electrode 28 in the ESD protection layer 12b.

FIG. 5A is a schematic plan view and FIG. 5B is a schematic cross-sectional view showing one example of a layer structure near the first gap electrode 28 in the ESD protection layer 12b, respectively. A configuration of the second to fourth gap electrodes 29 to 31 are the same as that of the first gap electrode 28, and therefore redundant explanations will be omitted.

The ESD protection layer 12b includes the base insulation layer 27 formed on a surface of the magnetic substrate 11a, a pair of the electrodes 28a and 28b constituting the first gap electrode 28, the ESD absorbing layer 33 arranged between the electrodes 28a and 28b, and protection layer 36 formed on the ESD absorbing layer 33. In this ESD protection layer 12b, the ESD absorbing layer 33 functions as a low-voltage discharge type ESD protection material. The ESD absorbing layer 33 is designed to secure initial discharge between the electrodes 28a and 28b via the ESD absorbing layer 33 when an excess voltage of ESD is applied.

The base insulation layer 27 is made of an insulation material. In the first embodiment, the base insulation layer 27 covers a whole surface of the magnetic substrate 11a from easiness of manufacturing. However, the base insulation layer 27 does not need to cover the whole surface when the base insulation layer 27 is at least a base of the electrodes 28a and 28b and the ESD absorbing layer 33.

As a detailed example of the base insulation layer 27, there can be suitably used a substance obtained by forming an insulation film made of a low-dielectric-constant material having a dielectric constant equal to or lower than 50, preferably equal to or lower than 20, of NiZn ferrite, aluminum, silica, magnesia, and aluminum nitride, on the surface of the first magnetic substrate 11a. A method of forming the base insulation layer 27 is not particularly limited, and a known method can be applied such as a vacuum deposition method, a reactive deposition method, a sputtering method, an ion plating method, and a gas phase method such as CVD and PVD. A film thickness of the base insulation layer 27 can be suitably set.

A pair of the electrodes 28a and 28b is arranged with a distance from each other on the surface of the base insulation layer 27. In the first embodiment, the pair of the electrodes 28a and 28b is arranged opposite to each other with a gap distance AG at a predetermined position on the base insulation layer 27.

As materials constituting the electrodes 28a and 28b, there can be mentioned at least one kind of metal or an alloy of metals selected from Ni, Cr, Al, Pd, Ti, Cu, Ag, Au, and Pt, for example. However, metals are not particularly limited thereto. In the first embodiment, while the electrodes 28a and 28b are formed in a rectangular shape as a planar view, the shape is not particularly limited thereto, and can be a comb-teeth shape or a saw-teeth shape.

The gap distance AG between the electrodes 28a and 28b can be suitably set by considering a desired discharge characteristic. Although not particularly limited, the gap distance AG is usually about 0.1 to 50 μm. From the viewpoint of securing low-voltage initial discharge, the gap distance AG is more preferably about 0.1 to 20 μm, and further preferably about 0.1 to 10 μm. A thickness of the electrodes 28a and 28b can be suitably set, and it is usually about 0.05 to 10 μm although not particularly limited thereto.

The ESD absorbing layer 33 is arranged between the electrodes 28a and 28b. In the first embodiment, the ESD absorbing layer 33 is laminated on the surface of the base insulation layer 27 and on the electrodes 28a and 28b. A size and a shape and a layout position of the ESD absorbing layer 33 are not particularly limited so long as the ESD absorbing layer 33 is designed to secure initial discharge between the electrodes 28a and 28b via the self when an excess voltage is applied.

The ESD absorbing layer 33 is a composite of a sea-island structure having an aggregate of a conductive inorganic material 35 dispersed discontinuously in a matrix of an insulation inorganic material 34. In the first embodiment, the ESD absorbing layer 33 is formed by sequentially performing sputtering. Specifically, the conductive inorganic material 35 is partially (incompletely) filmed by sputtering, on at least one of an insulation surface of the base insulation layer 27 and the electrodes 28a and 28b. Thereafter, the insulation inorganic material 34 is sputtered, thereby forming a composite of a laminating structure of a layer of the conductive inorganic material 35 dispersed in a so-called island shape and a layer of the insulation inorganic material 34 covering the layer of the conductive inorganic material 35.

As an example of the insulation inorganic material constituting a matrix, a metal oxide and a metal nitride can be mentioned, but the material is not limited thereto. Considering insulation and costs, $Al_2O_3$, $TiO_2$, $SiO_2$, ZnO, $In_2O_3$, NiO, CoO, $SnO_2$, $V_2O_5$, CuO, MgO, $ZrO_2$, AlN, BN, and SiC are preferable. Either one kind or two or more kinds of these materials can be used. Among these materials, from the viewpoint of giving high insulation to an insulation matrix, $Al_2O_3$ or $SiO_2$ is more preferably used. On the other hand, from the viewpoint of giving semiconductivity to the insulation matrix, $TiO_2$ or ZnO is more preferably used. When semiconductivity is given to the insulation matrix, ESD protection elements having excellent discharge starting voltage and clamp voltage can be obtained. While a method of giving semiconductivity to the insulation matrix is not particularly limited, $TiO_2$ or ZnO can be used as a single material, or these materials can be used together with other insulation inorganic material 34. Particularly, $TiO_2$ has oxygen easily lost at the time of sputtering in an argon atmosphere, and electric conductivity tends to become high. Therefore, it is particularly preferable to use $TiO_2$ to give semiconductivity to the insulation matrix. The insulation inorganic material 34 also functions as a protection layer that protects the pair of the electrodes 28a and 28b and the conductive inorganic material 35 from an optional layer (for example, the insulation layer 16a) positioned on an upper layer.

As an example of the conductive inorganic material 35, a metal, an alloy, a metal oxide, a metal nitride, a metal carbide, and a metal boride can be mentioned. However, the conductive inorganic material 35 is not limited to these materials. Considering conductivity, C, Ni, Cu, Au, Ti, Cr, Ag, Pd, and Pt, or an alloy of these materials are preferable.

A combination of Cu, $SiO_2$, and Au is particularly preferable for a combination of the electrode 28, the insulation inorganic material 34, and the conductive inorganic material 35. ESD protection elements constituted by these materials are not only excellent in an electric characteristic but also are extremely advantageous in workability and costs. Particularly, a composite of a sea-island structure having an aggregate of the conductive inorganic material 35 of an island shape dispersed discontinuously can be formed in high precision and easily.

A total thickness of the ESD absorbing layer 33 is not particularly limited and can be suitably set. From the viewpoint of achieving a thinner film, the total thickness is preferably 10 nm to 10 μm. More preferably, the total thickness is 15 nm to 1 μm, and further preferably, it is 15 to 500 nm. In forming a layer of the conductive inorganic material 35 of an island shape dispersed discontinuously and a layer of the matrix of the insulation inorganic material 34 like in the first embodiment, a thickness of the layer of the conductive inorganic material 35 is preferably 1 to 10 nm, and the thickness of the layer of the insulation inorganic material 34 is preferably 10 nm to 10 μm, more preferably 10 nm to 1 and further preferably 10 to 500 nm.

A method of forming the ESD absorbing layer 33 is not limited to the sputtering method described above. The ESD absorbing layer 33 can be formed by giving the insulation inorganic material 34 and the conductive inorganic material 35 onto at least one of the insulation surface of the base insulation layer 27 and the electrodes 28a and 28b, by applying a known thin-film forming method.

In the ESD protection layer 12b of the first embodiment, the ESD absorbing layer 33 containing the island-shape conductive inorganic material 35 dispersed discontinuously in the matrix of the insulation inorganic material 34 functions as a low-voltage discharge type ESD protection material. By employing this configuration, it is possible to realize high-performance ESD protection elements having a small electrostatic capacitance, a low discharge starting voltage, and excellent discharge resistance. For the ESD absorbing layer 33 functioning as a low-voltage discharge type ESD protection material, a composite constituted by at least the insulation inorganic material 34 and the conductive inorganic material 35 is employed. Therefore, heat resistance is increased as compared with that of the conventional organic-inorganic composite film described above, and a characteristic does not easily vary due to external environments such as temperature and humidity. As a result, reliability is increased. The ESD absorbing layer 33 can be formed by a sputtering method. Accordingly, productivity and economics are more increased. The ESD protection elements in the first embodiment can be configured such that the ESD absorbing layer 33 contains an element configuring the electrodes 28a and 28b by partially dispersing the electrodes 28a and 28b in the ESD absorbing layer 33 by applying a voltage to between the electrodes 28a and 28b.

Figure 6:
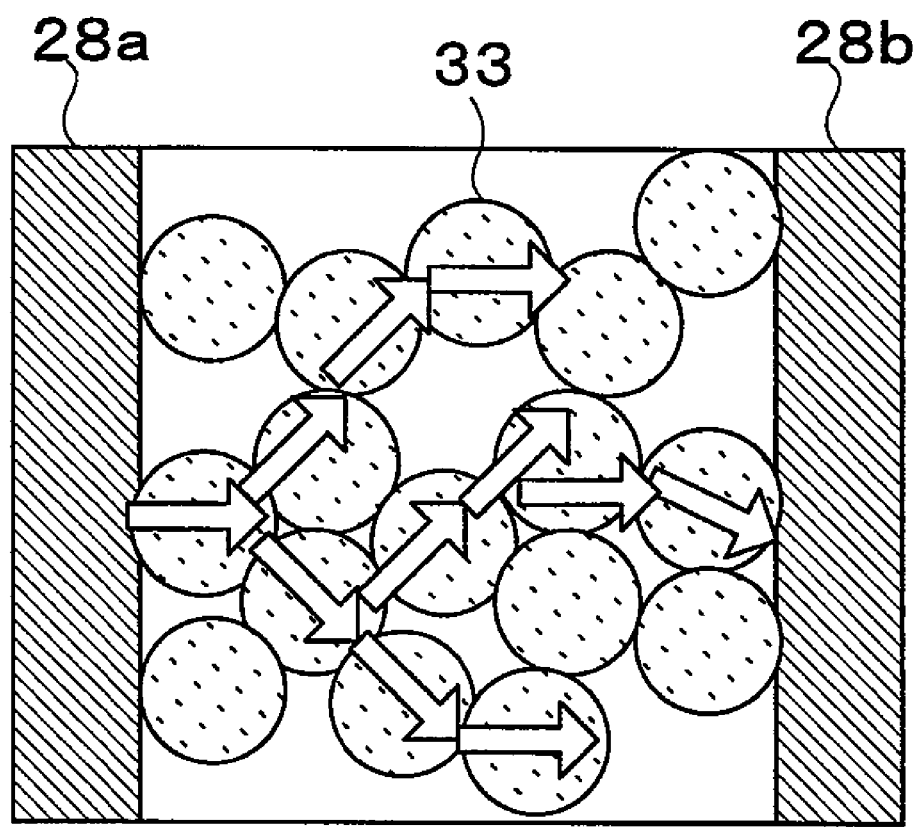
FIG. 6 is a schematic view for explaining a principle of the ESD protection elements.

FIG. 6 is a schematic view for explaining a principle of the ESD protection elements.

As shown in FIG. 6, when a discharge voltage based on ESD is applied to between a pair of the electrodes 28a and 28b, the discharge current flows from the electrode 28a toward the electrode 28b (ground) passing through an optional route constituted by the island-shape conductive inorganic material 35 discontinuously dispersed in the matrix of the insulation inorganic material 34 as shown by arrowheads. In this case, the conductive inorganic material 35 at a ground point having a large concentration of energy in the current route is destroyed together with the insulation inorganic material 34, and discharge energy of ESD is absorbed. Although a destroyed route becomes nonconductive, ESD can be absorbed at plural times because many current routes are formed by the island-shape conductive inorganic material 35 discontinuously dispersed, as shown in FIG. 6.

As explained above, the composite electronic device 100 according to the first embodiment includes low-voltage type ESD protection elements having a small electrostatic capacitance, a low discharge starting voltage, and excellent discharge resistance, heat resistance, and weatherability. Therefore, a composite electronic device functioning as a common mode filter including a high-performance ESD protection function can be realized.

According to the first embodiment, the insulation inorganic material 34 and the conductive inorganic material 35 are used as materials of the ESD protection layer 12b. Because a resin is not contained in various materials configuring the ESD protection layer 12b, the ESD protection layer 12b can be formed on the magnetic substrate 11a, and the common-mode filter layer 12a can be formed on the ESD protection layer 12b. To form the common-mode filter layer 12a by a so-called thin-film forming method, a heat processing step at 350° C. or above is necessary. To form the common-mode filter layer 12a by a so-called layer laminating method of sequentially laminating ceramic sheets formed with conductor patterns, a heat processing step at 800° C. is necessary. However, when the insulation inorganic material 34 and the conductive inorganic material 35 are used as materials of the ESD protection layer, the materials can bear the heat processing step, and ESD protection elements functioning normally can be formed. The ESD protection elements can be formed on a sufficiently flat surface on a magnetic substrate, and a fine gap of gap electrodes can be stably formed.

According to this embodiment, the formation positions of the gaps are closer to the outside than the outermost circumferences of the spiral conductors 17 and 18, and the gaps can be provided at the positions apart from the conductor patterns, such as the first and second spiral conductors 17 and 18 and the first and second lead conductors 19 and 20, without overlapping the conductor patterns on the plane. Therefore, an influence of a vertical direction when the ESD protection elements are partially destroyed due to static electricity can be suppressed, and a composite electronic device having higher reliability can be realized. In particular, if the gaps are made to come close to the outermost circumferences of the spiral conductors and are configured to have shapes along the outermost circumferences of the spiral conductors, the gaps can be formed in the rectangular mounting surface as deep as possible, and the gaps of the arc-shape that have the sufficient lengths can be formed. When the gaps have the sufficient lengths, plural current paths can be secured and absorption of static electricity of plural times is enabled. Accordingly, durability of the ESD protection elements can be heightened.

According to the first embodiment, as shown in FIG. 2, the composite electronic device 100 is mounted on the pair of signal lines, and a pair of the ESD protection elements 15a and 15b (or the ESD protection elements 15c and 15d) are provided nearer to the input side of the signal lines than to the common mode filter (14a, 14b). Therefore, absorption efficiency of an excess voltage of the ESD protection elements can be increased. Usually, an excess voltage of ESD is an abnormal voltage having no balance in impedance matching, and therefore, is once reflected at an input end of the common mode filter. This reflection signal is superimposed with an original signal waveform. A signal of an increased voltage is absorbed at once by the ESD protection elements. That is, a common mode filter at a latter stage of the ESD protection elements increases a size of the waveform to larger than that of the original waveform. Therefore, it is possible to generate a state that the signal can be more easily absorbed by the ESD protection elements than when the signal is absorbed in a state of a low voltage level. By inputting a once-absorbed signal into the common mode filter in this way, fine noise can be removed.

Further, since the composite electronic device 100 according to this embodiment is symmetric circuit in which a pair of the ESD protection elements is provided at both side of the input and output of the circuit, chip can be free from the restriction of the mounting direction.

A method of manufacturing the composite electronic device 100 according to the first embodiment is explained in detail next.

Figure 7:
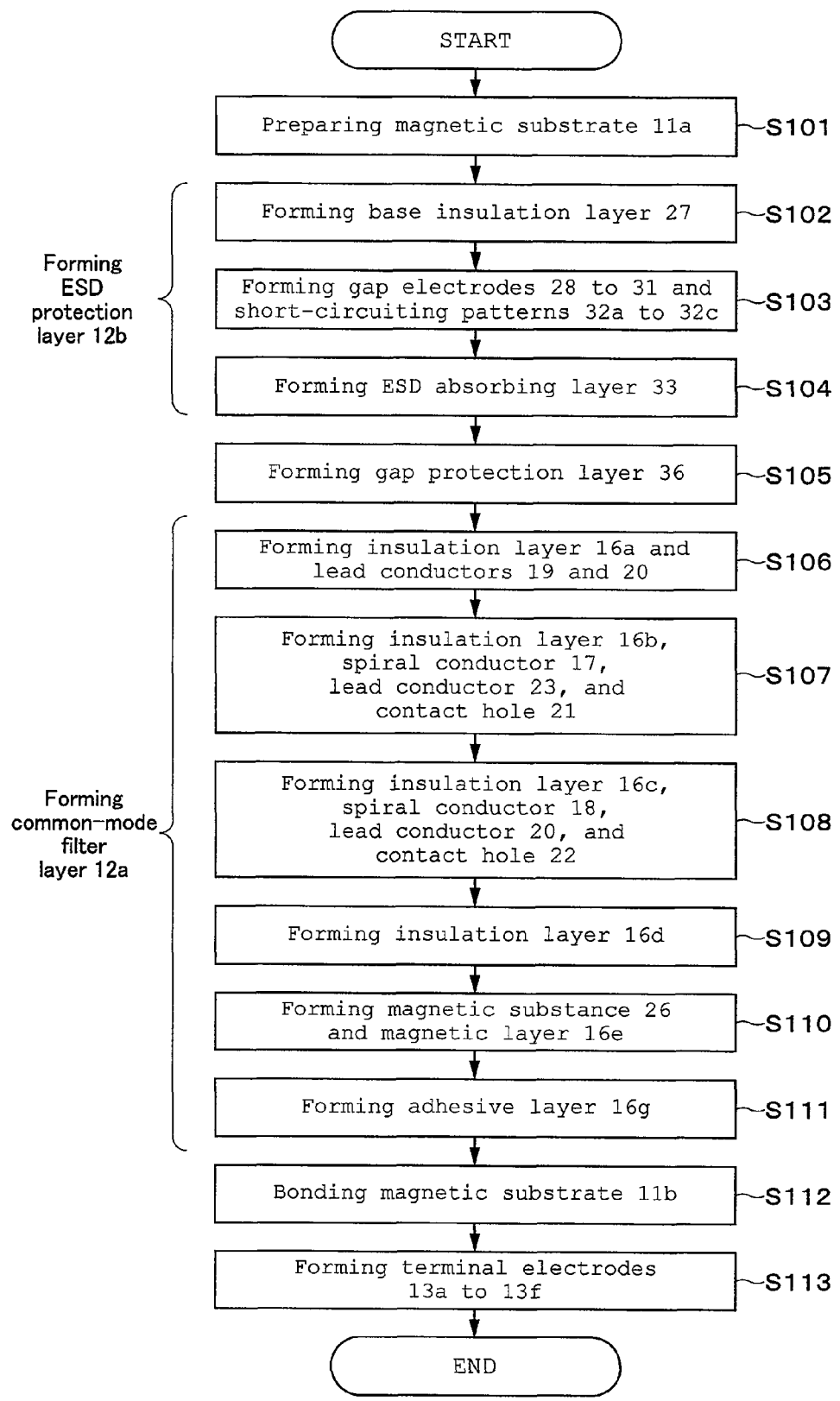
FIG. 7 is a flowchart showing a manufacturing step of the composite electronic device 100.

FIG. 7 is a flowchart showing a manufacturing step of the composite electronic device 100.

In the method of manufacturing the composite electronic device 100, the first magnetic substrate 11a is first prepared (Step S101), the ESD protection layer 12b is formed on the surface of the first magnetic substrate 11a (Steps S102 to S105), and the common-mode filter layer 12a is formed on the surface of the ESD protection layer 12b (Steps S106 to S111). The second magnetic substrate 11b is laminated (Step S112). Thereafter, the terminal electrodes 13a to 13f are formed on the external peripheral surface (Step S113), thereby completing the composite electronic device 100 having the common-mode filter layer 12a and the ESD protection layer 12b sandwiched between the first and second magnetic substrates 11a and 11b.

The method of manufacturing the composite electronic device 100 according to the first embodiment is used to consistently form the common-mode filter layer 12a and the ESD protection layer 12b by the thin-film forming method. The thin-film forming method is a method of forming a multilayer film having insulation layers and conductor layers alternately formed, by forming insulation layers by coating a photosensitive resin, exposing and developing this layer, and thereafter by repeating a step of forming conductor patterns on a surface of the insulation layers. A step of forming the ESD protection layer 12b and the common-mode filter layer 12a is explained in detail below.

In the formation of the ESD protection layer 12b, the base insulation layer 27 is first formed on the surface of the magnetic substrate 11a (Step S102). A method of forming the base insulation layer 27 is not particularly limited, and a known method can be applied such as a vacuum deposition method, a reactive deposition method, a sputtering method, an ion plating method, and a gas phase method such as CVD and PVD. A film thickness of the base insulation layer 27 can be suitably set.

The gap electrodes 28 to 31 and short-circuiting patterns 32a to 32c are formed on the surface of the base insulation layer 27 (Step S103). The gap electrodes 28 to 31 and short-circuiting patterns 32a to 32c can be formed by forming a film of an electrode material on the whole surface of the base insulation layer 27, and thereafter by patterning the electrode material. Because the gap distance AG between the pair of electrodes is very fine like about 0.1 to 50 μm, a high-precision patterning is required, and flatness of the base surface is also required. Because the base insulation layer 27 is formed on the magnetic substrate 11a having high flatness and the base insulation layer also has high flatness, a fine gap width can be controlled in high precision.

The ESD absorbing layer 33 is formed on the surface of the base insulation layer 27 on which the gap electrodes 28 to 31 and short-circuiting patterns 32a to 32c are formed (Step S104). Specifically, the conductive inorganic material 35 is partially (incompletely) filmed by sputtering, on at least one of the insulation surface of the base insulation layer 27 and the electrodes 28a and 28b. Thereafter, the insulation inorganic material 34 is sputtered, thereby forming a composite of a laminating structure of a layer of the conductive inorganic material 35 dispersed in an island shape and a layer of the insulation inorganic material 34 covering the layer of the conductive inorganic material 35. Further, the protection layer 36 made of composite ferrite is formed on the ESD absorbing layer 33 (Step S105). As a result, the ESD protection layer 12b is completed.

In the formation of the common-mode filter layer 12a, insulation layers and conductor patterns are alternately formed, thereby forming the insulation layers 16a to 16d, the first and second spiral conductors 17 and 18, and the first and second lead conductors 19 and 20 (Steps S106 to S109). Specifically, after the insulation layer 16a is formed on the ESD protection layer 12b, the first and second lead conductor 19, 20 are formed on the insulation layer 16a (Step S106). Next, after the insulation layer 16b is formed on the insulation layer 16a, the first spiral conductor 17 and third lead conductor 23 are formed on the insulation layer 16b, and a contact hole 21 piercing through the insulation layer 16b is formed (Step S107). After the insulation layer 16c is formed on the insulation layer 16b, the second spiral conductor 18 and fourth lead conductor 24 are formed on the insulation layer 16c, and contact hole conductor 22 piercing through the insulation layers 16c and 16b is formed (Step S108). Further, the insulation layer 16d is formed on the insulation layer 16c (Step S109).

The insulation layers 16a to 16d can be formed by spin coating a photosensitive resin on the base surface, and by exposing and developing the photosensitive resin. Particularly, the insulation layers 16b to 16d can be formed as insulation layers having the opening 25. Conductor patterns such as spiral conductors can be formed by forming a conductor layer by a deposition method or by a sputtering method, and thereafter by patterning the conductor layer.

The paste of the composite ferrite is filled into the opening 25, and the paste of the composite ferrite is further applied on the surface of the insulation layer 16d evenly, thereby forming the magnetic core 26 and the magnetic layer 16e (Step S110). Thereafter, the adhesive layer 16f is formed (Step S111), and the second magnetic substrate 11b is bonded via the adhesive layer 16f (Step S112). The terminal electrodes 13a to 13f are formed on an external peripheral surface of a laminated body (Step S113), thereby completing the composite electronic device 100.

As explained above, the method of manufacturing a composite electronic device according to the first embodiment is a thin-film forming method for consistently forming the ESD protection layer 12b and the common-mode filter layer 12a. Therefore, the composite electronic device can be manufactured without via a special manufacturing step. The method of manufacturing a composite electronic device according to the first embodiment is for forming the ESD protection layer 12b on the magnetic substrate 11a, and forming the common-mode filter layer 12a on the ESD protection layer 12b. Therefore, the ESD protection elements can be formed on the surface of the magnetic substrate 11a having a relatively flat surface, and a composite electronic device having combined high-quality ESD protection elements and a common-mode filter can be manufactured.

Figure 8:
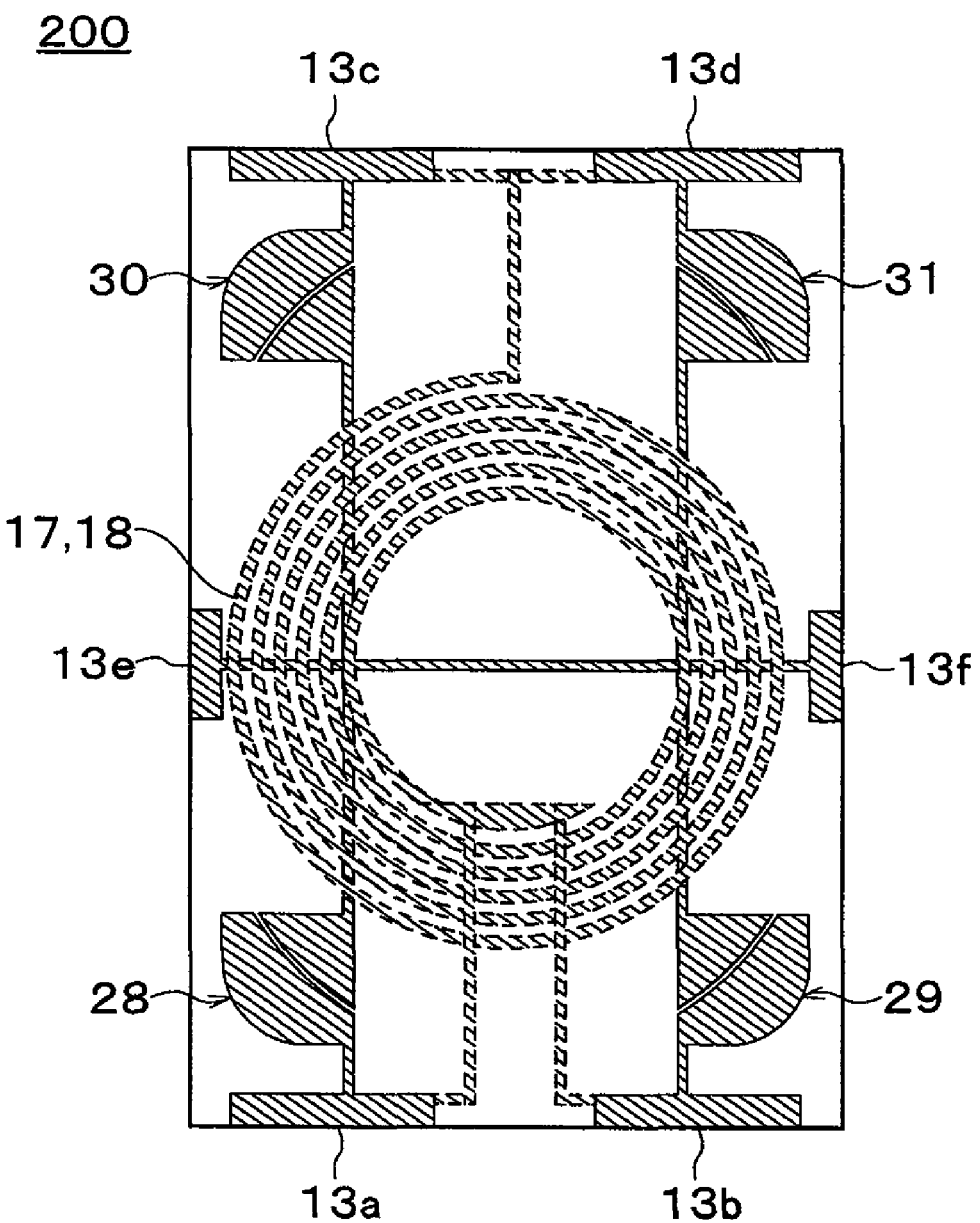
FIG. 8 is a schematic plan view transparently showing a configuration of a composite electronic device 200 according to a second embodiment of the present invention.

FIG. 8 is a schematic plan view transparently showing the structure of a composite electronic device 200 according to a second embodiment of the present invention.

As shown in FIG. 8, a composite electronic device 200 according to the second embodiment is characterized in that the entire of each gap electrodes 28 to 31 are provided at positions not overlapped on the spiral conductors 17 and 18. Since other configurations are the same as the composite electronic device 100 according to the first embodiment, the same reference numerals are used for the same constituent elements, and a description thereof is omitted.

When the spiral conductors 17 and 18 are disposed in the above way, a wider mounting area is needed and a chip size needs to be slightly increased. However, the same function and effect as those of the first embodiment can be achieved. That is, the formation positions of the gaps are closer to the outside than the outermost circumferences of the spiral conductors 17 and 18, and the gaps are provided at the positions not overlapped on the plane with the conductor patterns, such as the first and second spiral conductors 17 and 18 and the first and second lead conductors 19 and 20. Therefore, an influence of a vertical direction when the ESD protection elements are partially destroyed due to static electricity can be suppressed, and a composite electronic device having higher reliability can be realized. In particular, the gaps having the sufficient lengths can be formed and durability of the ESD protection elements can be heightened by securing plural current paths.

Figure 9:
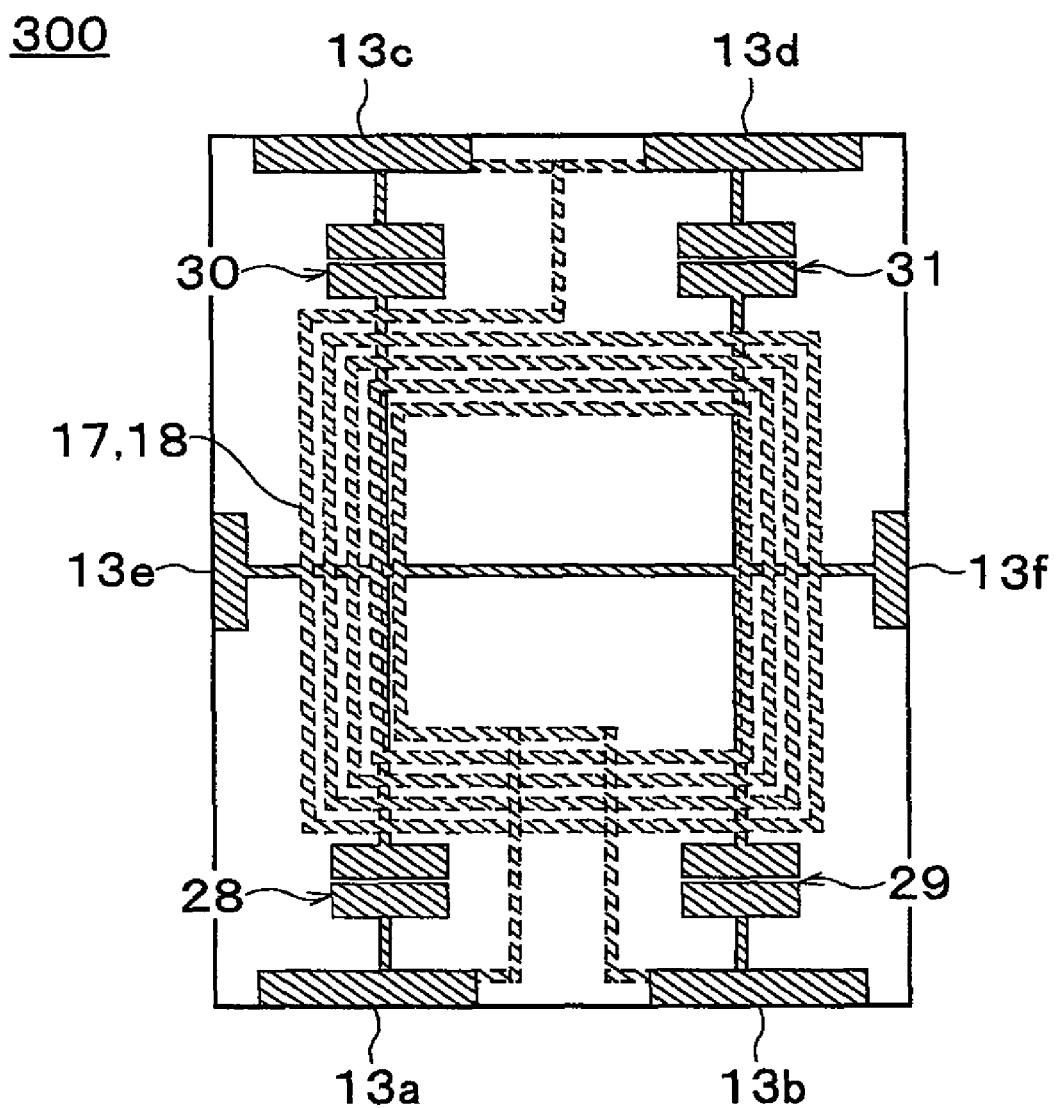
FIG. 9 is a schematic plan view transparently showing a configuration of a composite electronic device 300 according to a third embodiment of the present invention.

FIG. 9 is a schematic plan view transparently showing the structure of a composite electronic device 300 according to a third embodiment of the present invention.

As shown in FIG. 9, the composite electrode device 300 of this embodiment is characterized in that the spiral conductors is not an approximately round spiral conductor (a circular pattern formed by a curved line), but an approximately rectangular spiral conductor (an angle pattern formed by straight lines). Since other configurations are the same as the composite electronic device 100 according to the first embodiment, the same reference numerals are used for the same constituent elements, and a description thereof is omitted.

As such, the spiral shape and the gap shape of the composite electrode device 300 are different from those of the composite electronic device 100, but the same function and effect as those of the first embodiment can be achieved. That is, the formation positions of the gaps are closer to the outside than the outermost circumferences of the spiral conductors 17 and 18, and the gaps are provided at the positions not overlapped on the plane with the conductor patterns, such as the first and second spiral conductors 17 and 18 and the first and second lead conductors 19 and 20. Therefore, an influence of a vertical direction when the ESD protection elements are partially destroyed due to static electricity can be suppressed, and a composite electronic device having higher reliability can be realized. In particular, the gaps having the sufficient lengths can be formed and durability of the ESD protection elements can be heightened by securing plural current paths.

While preferred embodiments of the present invention have been explained above, the present invention is not limited thereto. Various modifications can be made to the embodiments without departing from the scope of the present invention and it is needless to say that such modifications are also embraced within the scope of the invention.

For example, in the above embodiments, while the ESD protection layer 12b is provided on a lower layer and the common-mode filter layer 12a is provided on an upper layer, the ESD protection layer 12b can be provided on an upper layer and the common-mode filter layer 12a can be provided on a lower layer. In this case, the ESD protection layer 12b is formed on the upper surface of the common-mode filter layer 12a. Therefore, the upper surface of the common-mode filter layer needs to have sufficient flatness.

In the above embodiments, the case where the ESD protection layer 12b includes the four gap electrodes 28 to 31 has been described, but the present invention is not limited to this configuration. For example, the configuration where only the two gap electrodes 28 and 29 connected to the terminal electrodes 13a and 13b are included or the case where only the two gap electrodes 30 and 31 connected to the terminal electrodes 13c and 13d are included may be used.

What is claimed is:

1. A composite electronic device comprising an inductor element and an ESD protection element formed between two magnetic substrates, wherein
    the inductor element includes a insulation layer made of a resin, and a spiral conductor formed on the insulation layer,
    the ESD protection element includes a base insulation layer, at least one pair of electrodes arranged via gap formed therebetween on the base insulation layer, and an ESD absorbing layer arranged at least between the pair of electrodes,
    the ESD absorbing layer includes a composite material having an insulation inorganic material and a conductive inorganic material discontinuously dispersed in a matrix of the insulation inorganic material, and
    the gap is provided at exterior of the spiral conductor of the inductor element so as not to be overlapped with the spiral conductor in view of a laminating direction.

2. The composite electronic device as claimed in claim 1, wherein the spiral conductor is a round spiral, and the gap has arc-shape along an outer circumference of the spiral conductor.

3. The composite electronic device as claimed in claim 1 further including a magnetic core provided at interior of the spiral conductor.

4. The composite electronic device as claimed in claim 1, wherein the number of the pair of electrodes is as same as that of input and output terminals of the inductor element.

5. The composite electronic device as claimed in claim 4 further including short-circuiting patterns electrically connecting each ground side of the pair of electrodes.

6. The composite electronic device as claimed in claim 1, wherein
    the inductor element includes first and second spiral conductors formed on a plane surface perpendicular to a laminating direction, and
    the first and second spiral conductors are magnetically coupled with each other and thereby constitute a common mode filter.

7. The composite electronic device as claimed in claim 1, wherein an electrostatic capacitance of the ESD protection element has a value equal to or lower than 0.35 pF.

8. The composite electronic device as claimed in claim 1, wherein
    the resin is one of the polyimide resin and an epoxy resin, and
    the insulation inorganic material is at least one kind selected from a group of $Al_2O_3$, $TiO_2$, $SiO_2$, ZnO, $In_2O_3$, NiO, CoO, $SnO_2$, $V_2O_5$, CuO, MgO, $ZrO_2$, AlN, BN, and SiC.

9. The composite electronic device as claimed in claim 1, wherein the conductive inorganic material is at least one kind of metal or a metal compound of these metals selected from a group of C, Ni, Cu, Au, Ti, Cr, Ag, Pd, and Pt.

10. A composite electronic device comprising a common-mode filter layer and an ESD protection layer provided between two magnetic substrates, wherein
    the common-mode filter layer includes
    first and second insulation layers made of a resin,
    a first spiral conductor formed on the first insulation layer, and
    a second spiral conductor formed on the second insulation layer,
    the ESD protection layer includes
    a first ESD protection element connected to one end of the first spiral conductor, and
    a second ESD protection element connected to one end of the second spiral conductor,
    the first and second spiral conductors are formed in a plane-surface direction perpendicular to a laminating direction, and are arranged to be magnetically coupled to each other,
    each of the first and second ESD protection elements includes a base insulation layer, a pair of electrodes arranged via gap formed therebetween on the base insulation layer, and ESD absorbing layer arranged at least between the pair of electrodes,
    the ESD absorbing layer includes a composite material having an insulation inorganic material and a conductive inorganic material discontinuously dispersed in a matrix of the insulation inorganic material, and
    the gap of the first and second ESD protection elements are provided at exterior of the first and second spiral conductors of the inductor element so as not to be overlapped with the first and second spiral conductors in view of the laminating direction.

11. The composite electronic device as claimed in claim 10 further including
    a third ESD protection element connected to the other end of the first spiral conductor, and
    a fourth ESD protection element connected to the other end of the second spiral conductor, wherein the third and fourth ESD protection elements have the same configurations as those of the first and second ESD protection elements, and the gap of the third and fourth ESD protection elements are provided at exterior of the first and second spiral conductors of the inductor element so as not to be overlapped with the first and second spiral conductors in view of the laminating direction.

* * * * *